United States Patent
Provo et al.

(10) Patent No.: US 7,154,139 B2
(45) Date of Patent: Dec. 26, 2006

(54) EMBEDDED CAPACITORS USING CONDUCTOR FILLED VIAS

(75) Inventors: Terry M. Provo, Palm Bay, FL (US); Andrew J. Thomson, Indialantic, FL (US)

(73) Assignee: Harris Corporation, Melbourne, FL (US)

( * ) Notice: Subject to any disclaimer, the term of this patent is extended or adjusted under 35 U.S.C. 154(b) by 14 days.

(21) Appl. No.: 11/093,543

(22) Filed: Mar. 30, 2005

(65) Prior Publication Data
US 2005/0221555 A1   Oct. 6, 2005

Related U.S. Application Data

(62) Division of application No. 10/816,637, filed on Apr. 2, 2004, now Pat. No. 6,908,809.

(51) Int. Cl.
*H01L 31/119*   (2006.01)
*H01L 23/52*   (2006.01)
*H01L 21/44*   (2006.01)

(52) U.S. Cl. .................. 257/311; 257/758; 438/677

(58) Field of Classification Search ............. 438/239, 438/637, 243, 453, 677; 257/303, 307, 311, 257/758
See application file for complete search history.

(56) References Cited

U.S. PATENT DOCUMENTS

| | | |
|---|---|---|
| 5,055,966 A | 10/1991 | Smith et al. |
| 5,339,212 A | 8/1994 | Geffken et al. |
| 5,396,397 A | 3/1995 | McClanahan et al. |
| 6,061,228 A | 5/2000 | Palmer et al. |
| 6,205,032 B1 | 3/2001 | Shepherd |
| 6,351,880 B1 | 3/2002 | Palmer et al. |

*Primary Examiner*—Calvin Lee
(74) *Attorney, Agent, or Firm*—Sacco & Associates, PA; Robert J. Sacco

(57) ABSTRACT

Embedded capacitors and a method for manufacturing the embedded capacitors. The method can include the steps of forming at least one bore (115) in a dielectric substrate (100). The dielectric substrate can be mechanically punched or laser cut to form the bore. The bore can be filled with a conductive material (250) to form a first electrode (470). A conductor (360) can be formed on the dielectric substrate, the conductor not being electrically continuous with the first electrode. A depth and/or cross sectional area of the bore can be selected to provide a desired amount of capacitive coupling between the electrode and the conductor. At least a second bore can be formed in the dielectric substrate and filled with a conductive material to form a second electrode. The second electrode can be electrically connected to the first electrode.

10 Claims, 6 Drawing Sheets

EMBEDDED CAPACITORS USING CONDUCTOR FILLED VIAS

CROSS REFERENCE TO RELATED APPLICATIONS

This application is a divisional of application Ser. No. 10/816,637 filed on Apr. 2, 2004 now U.S. Pat. No. 6,908,809.

BACKGROUND OF THE INVENTION

1. Statement of the Technical Field

The inventive arrangements relate generally to the field of capacitors, and more particularly to capacitors embedded in a substrate.

2. Description of the Related Art

Embedded capacitors are currently available in both printed wire board (PWB) and low temperature co-fired ceramic (LTCC) technologies. Typically, printed conductors are deposited on a substrate and used as electrodes for a capacitor. In some instances, the substrate itself can serve as the dielectric for the capacitor. In other arrangements, a via within the substrate can be filled with a dielectric material.

Using LTCC, the printed conductors are typically created using a printed. thick film process. Etching processes are typically used for PWB's. In either case, forming capacitors with tight tolerances can be difficult. In particular, it is often difficult to precisely control the area of the electrode. A small difference in electrode area can significantly change the capacitance of a part.

This problem is compounded further when trying to simultaneously create both high and low valued capacitors on a substrate. In such circumstances, high permittivity dielectrics are typically used so that high value capacitors can be formed in a volumetrically efficient manner. But the use of the high permittivity dielectrics requires that very small electrodes be used to achieve small value capacitors. Maintaining a tight tolerance on such electrodes can be extremely difficult. For example, when printing electrodes on LTCC, variables such as bleed-out, mesh density, and inaccuracies in the printing process each contribute to dimensional inaccuracies of the electrodes. Accordingly, a solution is needed for creating embedded capacitors wherein tight tolerances can be maintained over a large range of capacitance values.

SUMMARY OF THE INVENTION

The present invention relates to a method for manufacturing embedded capacitors. The method can include the steps of forming at least one bore in a dielectric substrate. The dielectric substrate can be mechanically punched or laser cut to form the bore. The bore can be filled with a conductive material to form a first electrode. Further, a conductor can be formed on the dielectric substrate, the conductor not being electrically continuous with the first electrode. A depth and/or cross sectional area of the bore can be selected to provide a desired amount of capacitive coupling between the electrode and the conductor. Further, a second conductor can be deposited on the dielectric substrate such that the first conductor is in electrical contact with the first electrode. At least a second bore can be formed in the dielectric substrate and filled with a conductive material to form a second electrode. The second electrode can be electrically connected to the first electrode.

The first bore can be formed in a first layer of the dielectric substrate. A second bore can be formed in a second dielectric layer. The second bore can be filled with a conductive material. Further, the first and second dielectric layers can be joined such that the conductive material in the first bore is electrically continuous with the conductive material in the second bore. The conductive material in the first and second bores can form an extended electrode.

The method for manufacturing embedded capacitors also can include the steps of forming at least one bore in a first dielectric layer and filling the bore with a conductive material. A first conductor can be disposed on the first dielectric layer, the first conductor being in electrical contact with the first electrode. A second conductor can be disposed on a second dielectric substrate. The first and second dielectric layers can be joined such that the first and second conductors are not electrically continuous. The dimensions of the first conductor and/or the second conductor can be selected to provide a desired amount of capacitive coupling between the first conductor and the second conductor.

The present invention also relates to an embedded capacitor which can include a substrate having an electrode. The electrode can include a conductive material which has been filled into a bore within the substrate. A first conductor can be disposed on the dielectric substrate. The first conductor can be in electrical contact with the first electrode.

The embedded capacitor also can include a conductor on the substrate which is not electrically continuous with the first electrode. The depth and/or cross sectional area of the bore can be selected to provide a desired amount of capacitive coupling between the electrode and the conductor. A second electrode also can be provided. The second electrode can include a conductive material which has been filled into a second bore within the substrate. The first and second bores can be electrically connected.

The substrate can include a plurality of dielectric layers. The first electrode can be disposed within a first layer of the substrate. A second electrode can be provided which includes a conductive material that has been filled into a second bore within a second layer of the substrate. The first and second bores can be electrically connected.

The present invention also relates to an embedded capacitor which includes a substrate having a plurality of dielectric layers. An electrode can be disposed in a first of the dielectric layers, the electrode including a conductive material which has been filled into a bore within the substrate. A first conductor can be disposed on the dielectric layer, the first conductor being in electrical contact with the electrode. Further, a second conductor can be disposed on a second of the dielectric layers, the second conductor not being electrically continuous with the electrode. Dimensions of the first and second conductors can be selected to provide a desired amount of capacitive coupling between the first and second conductors.

DETAILED DESCRIPTION OF THE PREFERRED EMBODIMENTS

The present invention provides a substrate having embedded capacitors formed therein. Notably, since the capacitors are formed within the substrate, a greater amount of substrate surface area is available for positioning of other components. Moreover, the size of a substrate can be reduced since area that would normally be used by surface mounted capacitors is no longer required.

The substrate can include one or more dielectric layers. Vias, or bores, can be provided in the dielectric layers. The vias can be filled with conductive material to form electrodes. A capacitor can be formed by an electrode, another conductor not electrically shorted to the electrode, and the dielectric material disposed between the electrode and other conductor. The amount of dielectric material disposed between the electrode and the other conductor can be controlled by selecting the depth of the electrode within the substrate. For example, the electrode can extend through a single dielectric layer, or a plurality of dielectric layers.

The electrodes formed within the vias can be manufactured with much higher tolerances than other types of electrodes. Higher manufacturing tolerances can be maintained because the cross sectional area and the depth of the vias can be accurately controlled. For example, the cross sectional area of the vias can be accurately controlled by using a high accuracy mechanical punching system or a laser cutting system. Further, the depth of the vias can be accurately controlled by the use of dielectric layers having precise thicknesses. Hence, costly processes, such as laser trimming, can be avoided. Such processes are sometimes used to adjust the size of the electrodes in order to tune capacitance values. Accordingly, forming electrodes using conductor filled vias results in a capacitor that can be manufactured more economically and with better quality than other types of low tolerance capacitors.

Moreover, the ability to tightly control electrode tolerances facilitates the use of dielectric layers having a very high relative permittivity. In consequence, embedded capacitors which have a wide range of capacitance values can be provided within a single substrate. For example, the dielectric layers can be provided with a relative permittivity ($\in_r$) from less than 6 to greater than 2400, and capacitors can be provided within the substrate that have values ranging from less than 20 pF to more than 220 nF.

Figure 1:
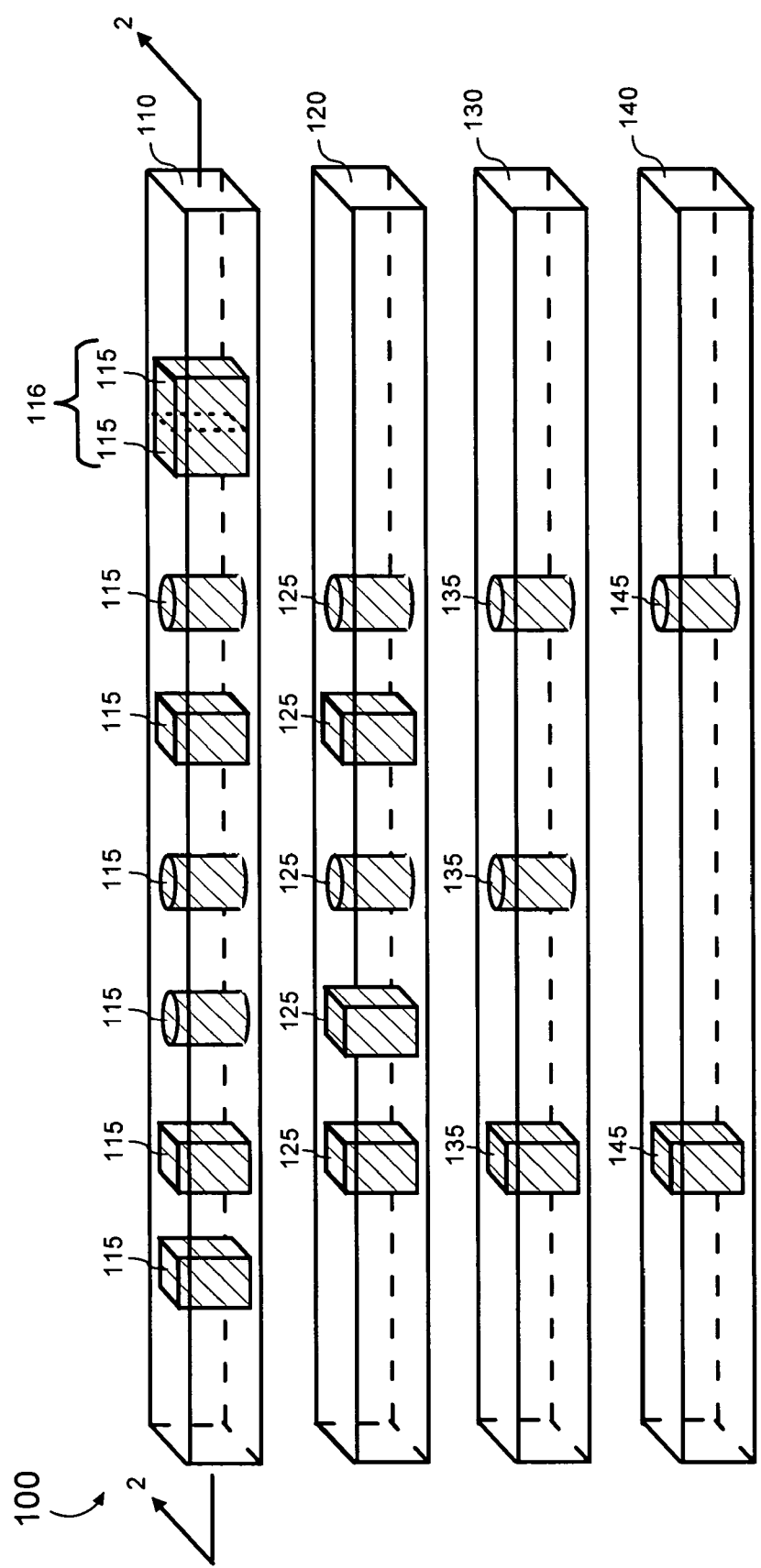
FIG. 1 is a perspective view of a plurality of substrate layers having vias for forming embedded capacitors which are useful for understanding the present invention.

Referring to FIG. 1, a cross-sectional view of a substrate 100 is shown which is useful for understanding the present invention. The substrate 100 can include one or more layers, for example layers 110, 120, 130, 140. Typical layer thicknesses can be from 0.5 mils to 10 mils. The substrate layers 110, 120, 130, 140 can be formed from any dielectric material wherein vias can be formed. For example, the substrate layers can be formed from ceramic material, such as low temperature co-fired ceramic (LTCC) or high temperature co-fired ceramic (HTCC). The substrate layers also can be formed from fiberglass or epoxy insulator reinforced with fiber, such as FR4. Moreover, polymers, such as polymide, polyester, polypropylene or other polymer film can be used as the dielectric. Still, the invention is not so limited and many other dielectric materials can be used.

An example of LTCC material that can be used is 951 Green Tape™, available The DuPont Company of Research Triangle Park, N.C. 27709. The relative permittivity ($\in_r$) of 951 Green Tape™ is approximately 7.8. Another LTCC material that can be used is part number K2400 available from Ferro Corp. of Cleveland, Ohio 44114. K2400 is available as a powder that can be used to formulate LTCC tape. K2400 has a relative permittivity ($\in_r$) of approximately 2400. Nonetheless, powders having other permittivity values are available. In one arrangement, the substrate 100 can comprise multiple substrate layers having different permittivity. Accordingly, electric field density can be different in different parts of the substrate 100. Such an arrangement can provide further control over the capacitance values of the embedded capacitors.

One or more vias 115 can be formed within the first substrate layer 110. Vias also can be formed within other substrate layers as well. For example, vias 125 can be formed in a second substrate layer 120, vias 135 can be formed in a third substrate layer 130, and vias 145 can be formed in a fourth substrate layer 140, and so on. Many techniques are available for forming vias in a substrate layer. For example, in some substrates, such as ceramic substrates, vias can be formed by laser cutting holes through the substrate, drilling holes through the substrate, or mechanically punching the holes. In a preferred arrangement, the vias can be mechanically punched as this allows the tolerance of the cross-sectional area of each via to be tightly controlled. For example, tolerances of ±0.1 mils can be maintained. Further, if a substrate is used that is subject to shrinkage, it is preferred that the substrate be preconditioned before being used in a fabrication process in order to minimize shrinkage after the vias have been formed. Such shrinkage can cause the tolerance of the vias to vary. An exemplary preconditioning process is discussed below.

The vias 115, 125, 135, 145 can be formed so that each via has a same cross sectional profile, or the size of each via 115 can be optimized to achieve a desired capacitance value once the vias have been filled with a conductive material. Vias also can be overlapped, or stepped, for example to form a larger via 116 with an increased cross sectional area. Further, vias 115, 125, 135, 145 can be formed to have any desired shape.

Figure 2:
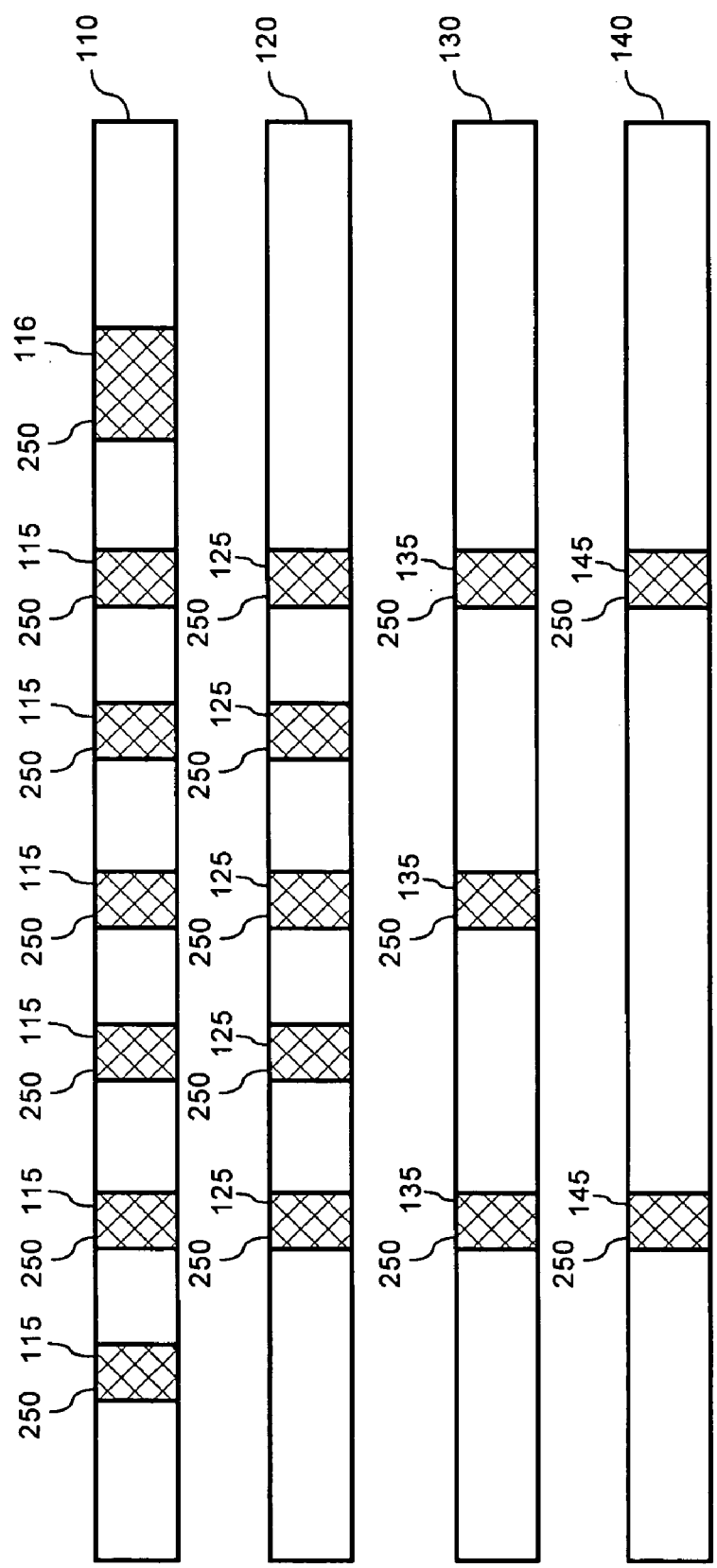
FIGS. 2–4 are a series of cross sectional views taken along section line 2—2 of FIG. 1, the cross sectional views showing a method of forming embedded capacitors in a substrate which are useful for understanding the present invention.

After the vias 115, 116, 125, 135, 145 have been formed in the substrate layers 110, 120, 130, 140, the vias can be filled with a conductive material 250, as shown in FIG. 2. The conductive material can be any suitably conductive material. For example, a conventional thick film screen printing material, such as that used in a standard emulsion thick film process, can be used to fill the vias. For instance, the conductive material can be a conductive paste. One such conductive paste is part number CN 33-343 silver via paste available from Ferro Corp. of Cleveland, Ohio 44114. Nonetheless, the invention is not so limited and any suitable conductive material that can be used to fill the vias can be used. Once the vias have been filled with a suitable conductive material, the substrate layers then can be baked to dry the conductive material within the vias. For example, if the substrate layers are LTCC, the substrate layers can be dried at 120° C. for 5 minutes.

Figure 3:
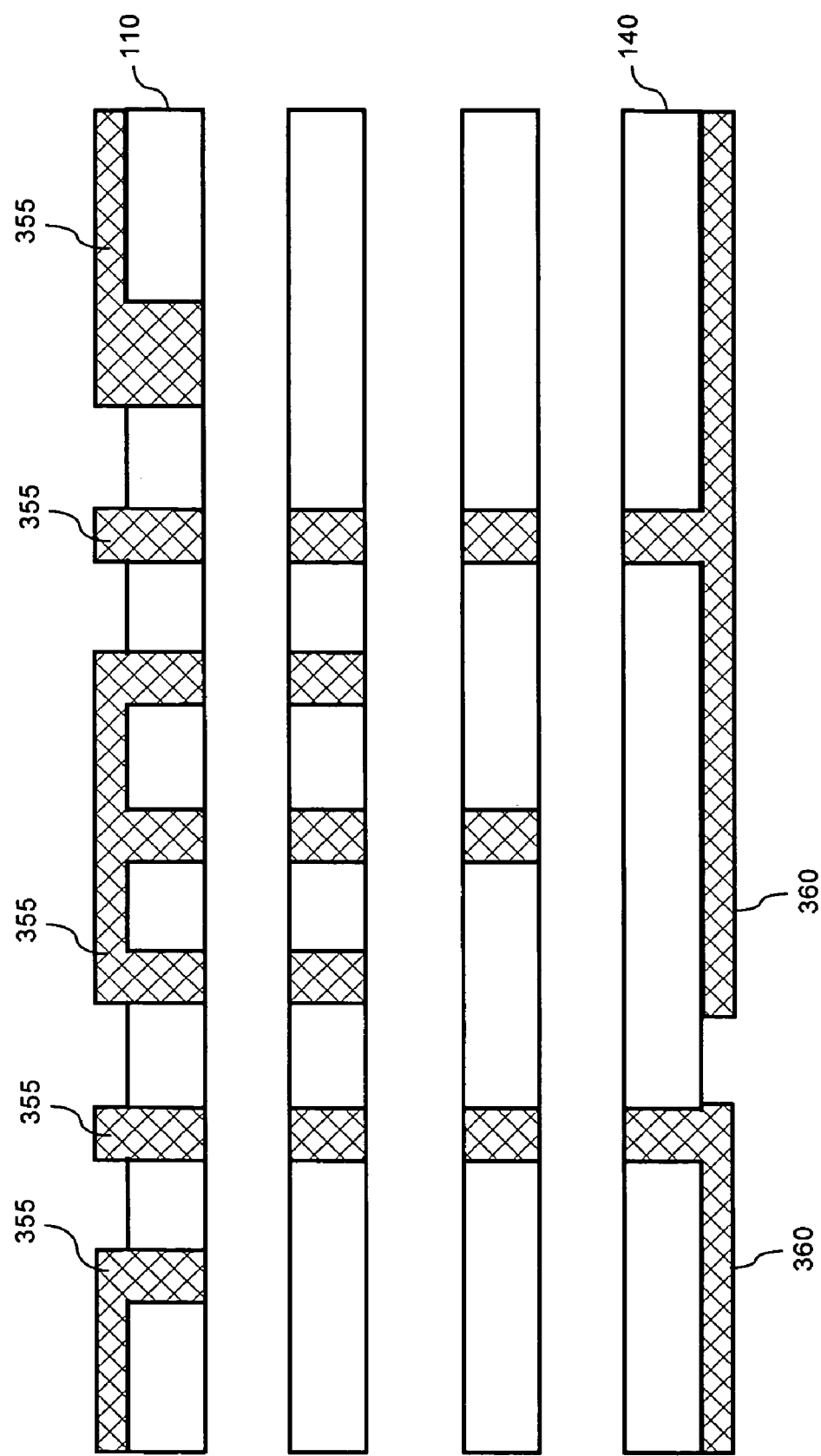

Referring to FIG. 3, conductive layers then can be deposited on the substrate layers, where required. The conductive layers can provide electrical connections to the electrodes. For example, a conductive layer 355 can be deposited on substrate layer 110 and a conductive layer 360 can be deposited on substrate layer 140. Again, a conventional thick film screen printing process can be used to deposit conductive layers on the substrate layers and the substrate layers can be baked to dry the conductive layers.

Figure 4:
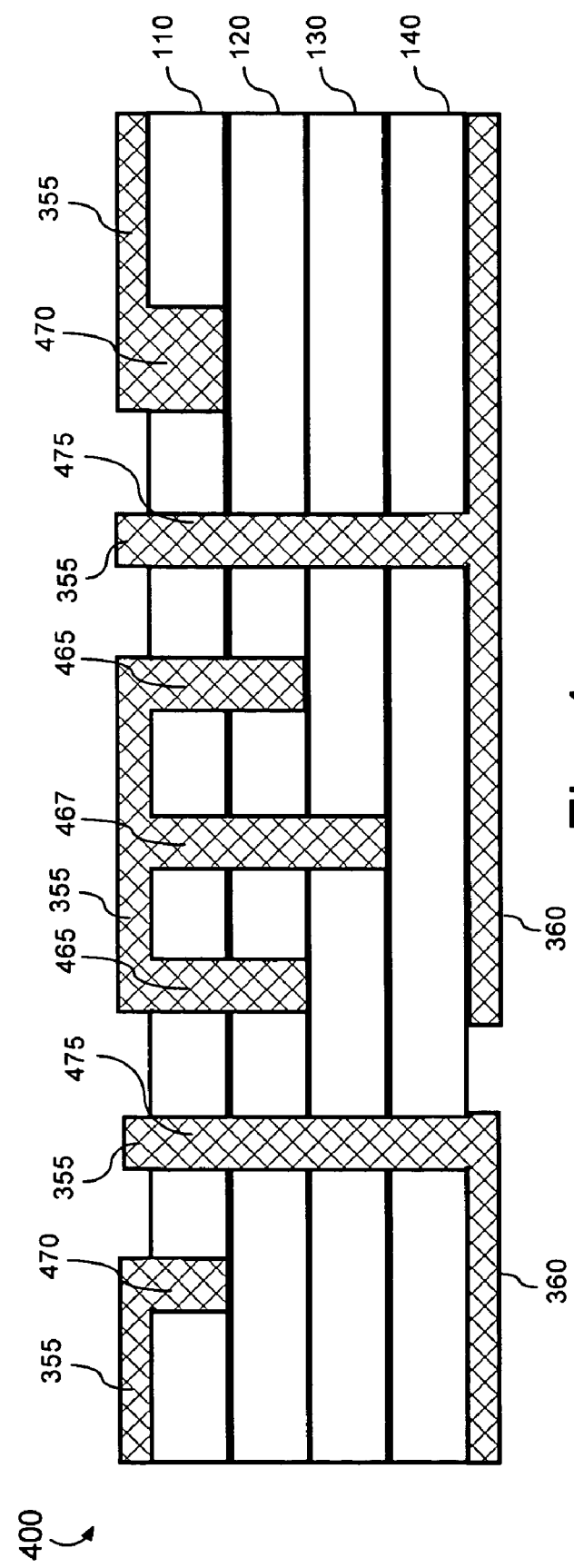

Once the conductive layers have been dried, the substrate layers 110, 120, 130, 140 can be joined to form substrate 400, as shown in FIG. 4. Notably, additional substrate layers (not shown) also can be joined to substrate layers 110, 120, 130, 140. The additional substrate layers also can comprise vias and conductive layers. In a preferred arrangement, conductor filled vias in the substrate layers 110, 120, 130, 140 which are opposingly disposed can be aligned to form electrodes 465, electrodes 467 and electrodes 475, each of which can extend through multiple substrate layers. Further, conductor filled vias not having associated vias in other substrate layers can form electrodes 470.

Various methods can be used to join the substrate layers. For example, the layers can be laminated together using a variety of lamination methods. In one method using ceramic substrate layers, the substrate layers can be stacked and hydraulically pressed with heated platens. For instance, a uniaxial lamination method can press the ceramic substrate layers together at 3000 psi for 10 minutes using plates heated to 70° C. The ceramic substrate layers can be rotated 180° following the first 5 minutes.

In an isotatic lamination process, the ceramic substrate layers can be vacuum sealed in a plastic bag and then pressed using heated water. The time, temperature and pressure can be the same as those used in the uniaxial lamination process; however, rotation after 5 minutes is not required. Once laminated, the structure can be fired inside a kiln on a flat tile. For example, the ceramic substrate layers can be baked between 200° C. and 500° C. for one hour and a peak temperature between 850° and 900° can be applied for greater than 15 minutes. After the firing process, post fire operations can be performed on the ceramic substrate layers.

A temperature release tape, such as P/N 3195M, available from Nitto Denko Co., Ltd. of Hong Kong, can be used to facilitate stacking of substrate layers during the lamination process. For example, the temperature release tape can be applied to each substrate stack (or substrate substack if more than one stack is used) to provide a solid base on which thin tape then can be mounted. For instance, a first piece of thin tape in the stack can be mounted to the temperature release tape to begin the stack. Each subsequent layer then can be laminated to that stack. The temperature release tape can be released from the substrate layers during the baking process. Using this process, correlating conductive vias in adjacent substrate layers and substacks can be electrically continuous.

In operation, electrodes 465, 467, 470 can be capacitively coupled to electrodes 475 and conductive layer 360. For example, the conductive layer 360 can be grounded so that the conductive layer 360 and electrodes 475 are grounded conductors. When a voltage is applied to the conductive layer 355, electric fields can form between the electrodes 465, 467, 470 and the grounded conductors. The amount of capacitance formed between the electrodes 465, 467, 470 and the grounded conductors is primarily a function of the relative permittivity of the substrate layers 110, 120, 130, 140, the surface area of the electrodes 465, 470, and the proximity of the surface of the electrodes to the grounded conductors. Accordingly, the surface area of the electrodes, the permittivity of the substrate layers 110, 120, 130, 140, and the distance between the substrates and the grounded conductors can be selected to achieve a desired capacitance value. For instance, the dimensions of electrodes 465 can be precisely selected for a desired capacitance value using substrate layers having a particular permittivity.

There may be some capacitive coupling between electrodes 465 and electrodes 475 due to the area of the parallel surfaces and the proximity of the electrodes 465 to the electrodes 475. However, this capacitive coupling is relatively insignificant at typical dimensions and via orientations. Further, the permittivity of the individual substrate layers 110, 120, 130 can be selected to reduce or increase capacitive coupling between the electrodes 465 and electrodes 475 as desired.

A significant portion of the capacitive coupling associated with electrode 467 can be determined by the capacitive coupling between the electrode 467 and the conductive layer 360 due to the proximity of the electrode 467 to the conductive layer 360. The thickness of the substrate layer 140 can be selected to achieve a desired distance between the electrode 467 and the conductive layer 360. Still, there will be capacitive coupling between the electrode 467 and electrodes 475. At this point it should be noted that the embodiment shown in FIG. 4 is shown for exemplary purposes and that the invention is not so limited. Importantly, any number of electrodes can be provided. Moreover, the grounded conductors need not include both electrodes 475 and conductive layer 360. For instance, one arrangement can include the conductive layer 360 as the only grounded conductor.

Figure 5:
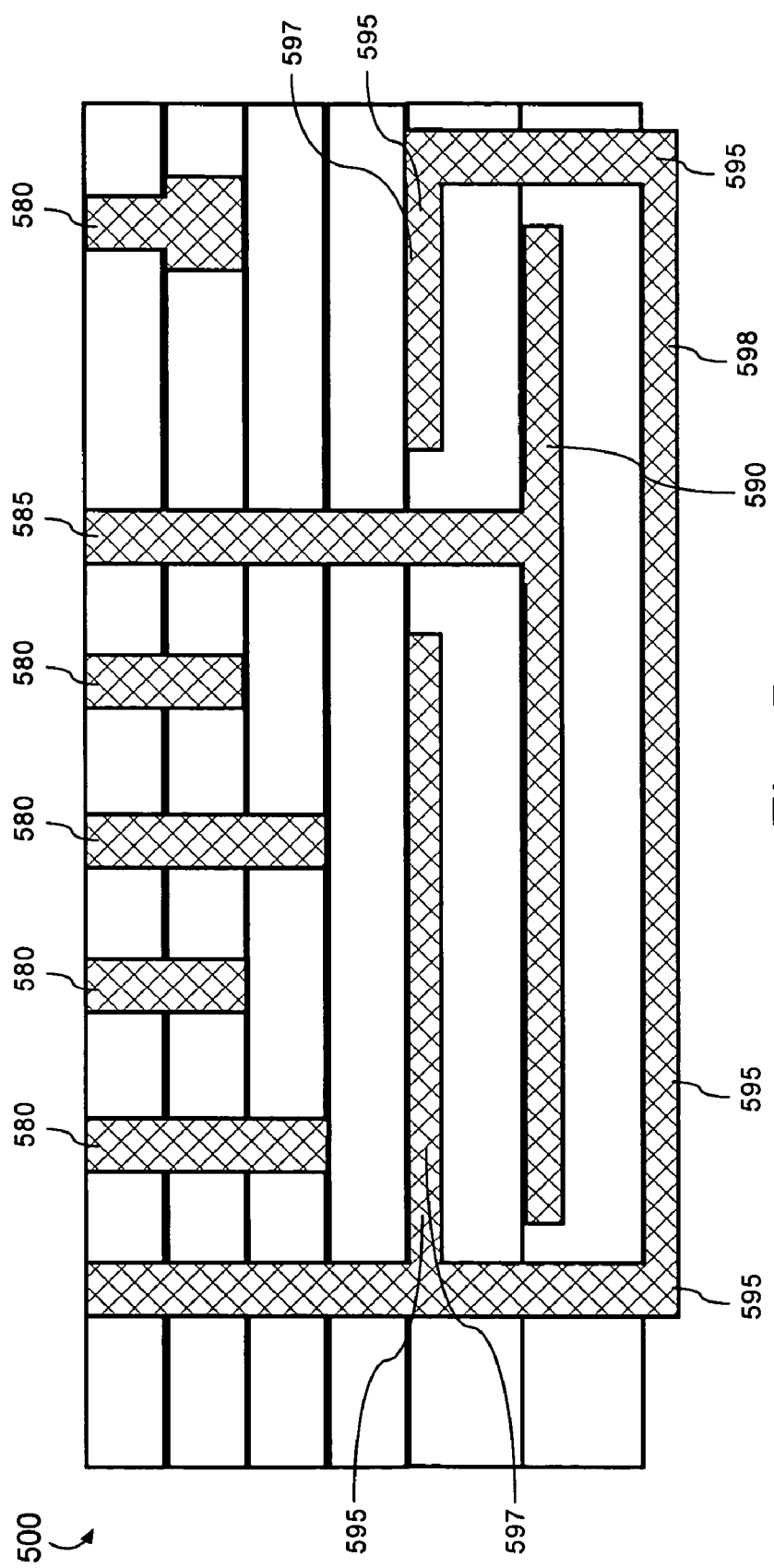
FIG. 5 is a cross sectional view of a substrate which includes alternate embodiments of embedded capacitors which are useful for understanding the present invention.

Referring to FIG. 5, an exemplary substrate is shown which includes electrodes 580. Low values of capacitance can be provided between the electrodes 580 and grounded conductors 595, for example values less than 50 pF. The capacitance values depend from the surface area of the electrodes, the permittivity of the substrate, and the distance between the electrodes and the grounded conductors. Further, an electrode 585 which is electrically coupled to a conductive layer 590 can be provided. Such a configuration can be used to provide a high capacitance value, for instance in excess of 10 nF, between the conductive layer 590 and the grounded conductors 595. In the arrangement shown, the conductive layer 590 can be disposed between grounded conductive layers 597, 598. Such an arrangement can result in a larger capacitance value in comparison to an instance where only a single grounded conductive layer is provided. In particular, the use of multiple conductive layers 597, 598 increases the surface area of the grounded conductors, thereby increasing the capacitive coupling. The surface area of the conductive layers can be selected to provide a desired capacitance value for a given substrate layer permittivity and thickness.

Figure 6:
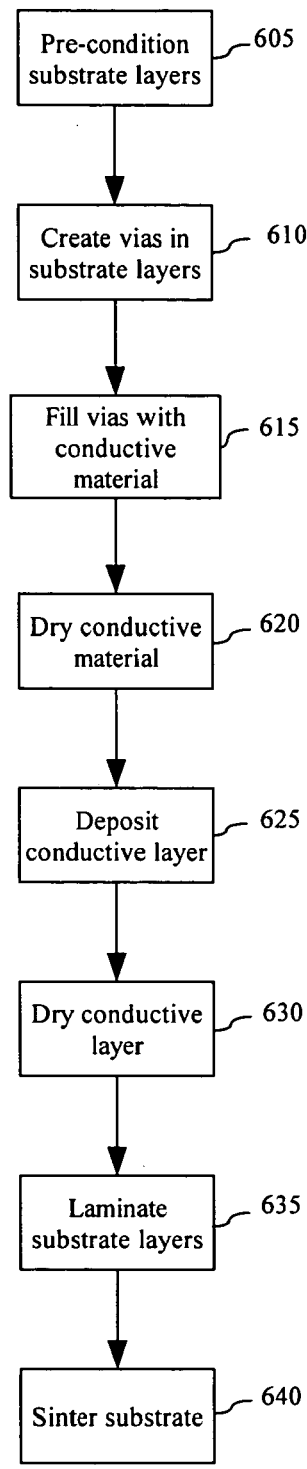
FIG. 6 is a flow chart of a method of manufacturing embedded capacitors in a substrate which are useful for understanding the present invention.

A method 600 of manufacturing embedded capacitors in a substrate is shown in FIG. 6. Referring to step 605, substrate layers can be preconditioned before being used in a fabrication process. For example, if the ceramic substrate material is used, the substrate can be baked at an appropriate temperature for a specified period of time or left to stand in a nitrogen dry box for a specified period of time. Common preconditioning cycles for ceramic material are 120° C. for 20–30 minutes or 24 hours in a nitrogen dry box. Both preconditioning process are well known in the art of ceramic substrates.

Referring to step 610, one or more vias, or bores, can be created in each of the substrate layers that are to incorporate vias. As previously noted many techniques are available for forming bores in a substrate layer, such as mechanically punching or laser cutting holes into the substrate layer. In the preferred arrangement, the vias are formed after the preconditioning of the substrate layers. However, if a particular dielectric does not exhibit much shrinkage due to the baking steps described below, the preconditioning step may not be required.

The vias can then be filled with a conductive material as shown in step 615. For example, as noted, a conventional thick film screen printing material can be used to deposit conductive material within the vias. The conductive material then can be dried as shown in step 620. For example, if the substrate layers are LTCC, the LTCC can be baked at 120° C. for 5 minutes.

Proceeding to step 625, conductive layers then can be deposited on the substrate layers. For example, a conventional thick film screen printing process, such as a standard thick film process, can be used to deposit conductive layers on the desired substrate layers. The substrate layer(s) then can be baked to dry the conductive traces, as shown in step 630.

Referring to step 635, the substrate layers can be laminated together after appropriate preconditioning and drying of circuit traces. A variety of techniques for laminating substrates are known to those skilled in the art of substrate manufacturing, as previously discussed. Once the substrate layers have been laminated, the laminated substrate structure then can be sintered, as shown in step 640. For example, in the case that the substrate is LTCC, the first and second substrate layer combination can be sintered at approximately 850° C. to 900° C. for 15 minutes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

The invention claimed is:

1. A plurality of embedded capacitors embedded in a multilayer substrate and having different capacitance values, comprising:
   a plurality of dielectric substrate layers arranged in a stack;
   at least one first electrode provided for each of said plurality of embedded capacitors formed from a conductive layer disposed on a surface of at least one of said substrate layers,
   a plurality of second electrodes, at least one of said second electrodes respectively provided for each of said plurality of embedded capacitors;
   each said second electrode comprised of a conductive material respectively contained within a bore which extends through at least one of said substrate layers, each said second electrode terminating at an end face having an end face surface area defined by a cross-sectional area of said born and aligned with a planar surface defined by one of said substrate layers at a location separated from said at least one first electrode by at least one substrate layer;
   wherein each said embedded capacitor with a different capacitive value has a different said end face surface area.

2. The plurality of embedded capacitors according to claim 1, wherein said end faces of said plurality of embedded capacitors having different capacitive values are respectively spaced from said at least one first electrode provided for each embedded capacitor by different numbers of said substrate layers to provide said different capacitive values.

3. The plurality of embedded capacitors according to claim 1, wherein said at least one first electrode is comprised of a common first electrode shared by said plurality of embedded capacitors and disposed on a surface of one of said substrate layers.

4. The plurality of embedded capacitors according to claim 1, wherein a conductive trace disposed on at least one of said substrate layers provides an electrical connection between a plurality of said second electrodes to combine said second electrodes in a single embedded capacitor.

5. A plurality of embedded capacitors embedded in a multilayer substrate and having different capacitance values, comprising:
   a plurality of dielectric substrate layers arranged in a stack;
   a common first electrode provided for each of said plurality of embedded capacitors formed from a conductive layer disposed on a surface of at least one of said substrate layers,
   a plurality of second electrodes, at least one of said second electrodes respectively provided for each of said plurality of embedded capacitors;
   each said second electrode comprised of a conductive material respectively contained within a bore which extends through at least one of said substrate layers, each said second electrode terminating at an end face having a surface area defined by a cross-sectional area of said bore and aligned with a planar surface defined by one of said substrate layers at a location separated from said common first electrode by at least one substrate layer;
   wherein each said embedded capacitor with a different capacitive value has a different said surface area.

6. The plurality of embedded capacitors according to claim 5, wherein said end faces of said plurality of embedded capacitors having different capacitive values are respectively spaced from said common first electrode by different numbers of said substrate layers to provide said different capacitive values.

7. The plurality of embedded capacitors according to claim 5, wherein a conductive trace disposed on at least one of said substrate layers provides an electrical connection between a plurality of said second electrodes to combine said second electrodes in a single embedded capacitor.

8. A plurality of embedded capacitors embedded in a multilayer substrate and having different capacitance values, comprising:
   a plurality of dielectric substrate layers arranged in a stack;
   a common first electrode provided for said plurality of embedded capacitors formed from a conductive layer disposed on a surface of at least one of said substrate layers,
   a plurality of second electrodes, at least one of said second electrodes respectively provided for each of said plurality of embedded capacitors;
   each said second electrode comprised of a conductive material respectively contained within a bore which extends through at least one of said substrate layers, each said second electrode terminating at an end face having a surface area defined by a cross-sectional area of said bore and aligned with a planar surface defined by one of said substrate layers at a location separated from said common first electrode by at least one substrate layer;

wherein said end faces of said plurality of embedded capacitors having different capacitive values are respectively spaced from said common first electrode by different numbers of said substrate layers to provide said different capacitive values.

9. The plurality of embedded capacitors according to claim 8, wherein each said embedded capacitor with a different capacitive value has a different said surface area.

10. The plurality of embedded capacitors according to claim 8, wherein a conductive trace disposed on at least one of said substrate layers provides an electrical connection between a plurality of said second electrodes to combine said second electrodes in a single embedded capacitor.

* * * * *